United States Patent [19]

Thoma et al.

[11] Patent Number: 5,725,706
[45] Date of Patent: Mar. 10, 1998

[54] LASER TRANSFER DEPOSITION

[75] Inventors: Eben Daniel Thoma; Richard Taylor Williams, both of Winston-Salem; Jeff Cherng-chou Wu, Clemmons, all of N.C.

[73] Assignee: The Whitaker Corporation, Wilmington, Del.

[21] Appl. No.: 628,752

[22] Filed: Mar. 12, 1996

[51] Int. Cl.$^6$ .................................................. B05D 3/06
[52] U.S. Cl. .................. 156/150; 156/233; 156/234; 156/272.8; 156/285; 430/201; 427/597
[58] Field of Search .................................... 430/200, 201, 430/257, 258, 259, 945, 270.1, 275.1; 204/192.1, 298.01, 298.25, 298.28; 156/150, 230, 233–235, 238, 240, 272.2, 272.6, 272.8, 273.3, 273.9, 274.6, 275.1, 285; 427/555, 597, 276

[56] References Cited

U.S. PATENT DOCUMENTS

| | | | |
|---|---|---|---|
| 3,884,787 | 5/1975 | Kuehnle | 204/192.1 |
| 4,427,498 | 1/1984 | Wagner | 204/26 |
| 4,534,843 | 8/1985 | Johnson et al. | 204/202 |
| 4,877,644 | 10/1989 | Wu et al. | 427/53.1 |
| 4,987,006 | 1/1991 | Williams et al. | 427/53.1 |
| 5,156,938 | 10/1992 | Foley et al. | 430/200 |
| 5,171,650 | 12/1992 | Ellis et al. | 430/20 |
| 5,173,441 | 12/1992 | Yu et al. | 437/173 |
| 5,256,506 | 10/1993 | Ellis et al. | 430/20 |

*Primary Examiner*—Michael W. Ball
*Assistant Examiner*—Michael A. Tolin

[57] ABSTRACT

The present invention is directed to a method for producing a smooth and continuous pressure bonded layer of a material on a base substrate through the driving force of a pulsed laser. The method comprises the steps of selecting a laser absorptive material. Then applying thereto a thin layer of the material for pressure bonding to the base substrate. Next, placing the base substrate and the thin layer of material on the laser absorptive material in a vacuum, then placing the base substrate in close proximity to the thin layer of material. Finally, directing pulsed laser energy toward the laser absorptive material and the layer to be pressure bonded, whereby the laser energy is absorbed by the laser absorptive material causing heating and vaporization thereof to a controlled depth of the laser absorptive material, leaving remaining portions of the laser absorptive material unvaporized after the vaporization to act as a support for the material to be bonded. After bonding, the thin material adheres to the base substrate when the remaining continuous absorptive material is peeled away, the vaporization having provided the necessary pressure for pressure bonding on to the base material.

16 Claims, 1 Drawing Sheet

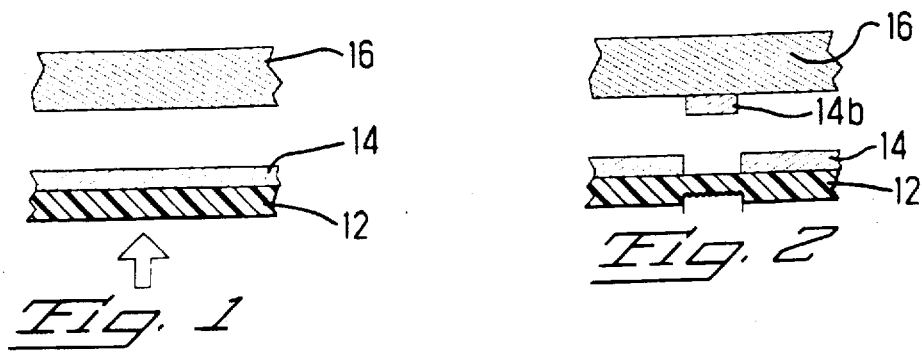
Fig. 1
Fig. 2
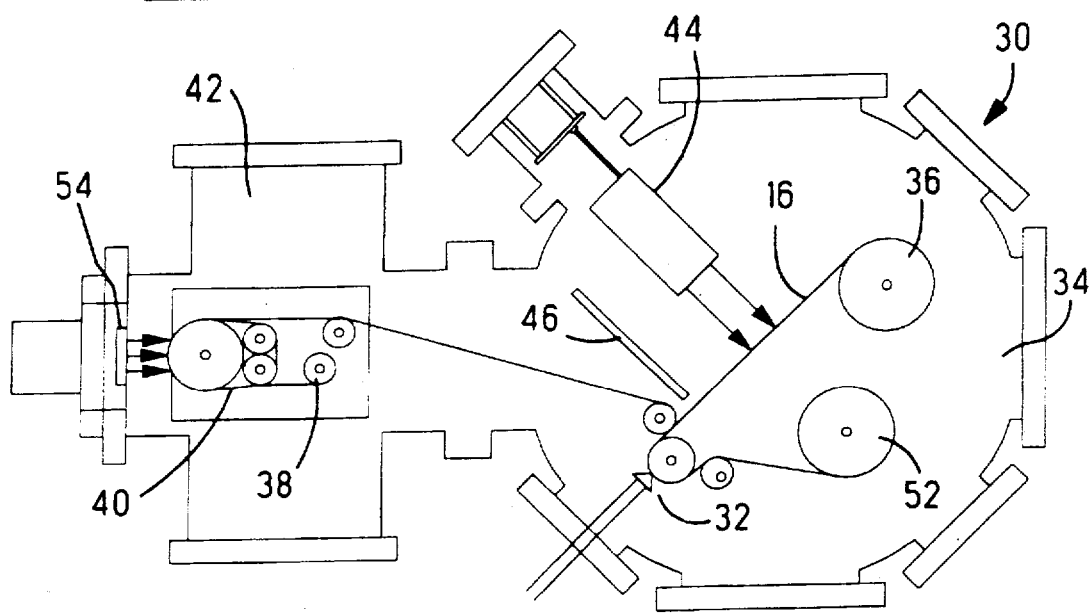
Fig. 3
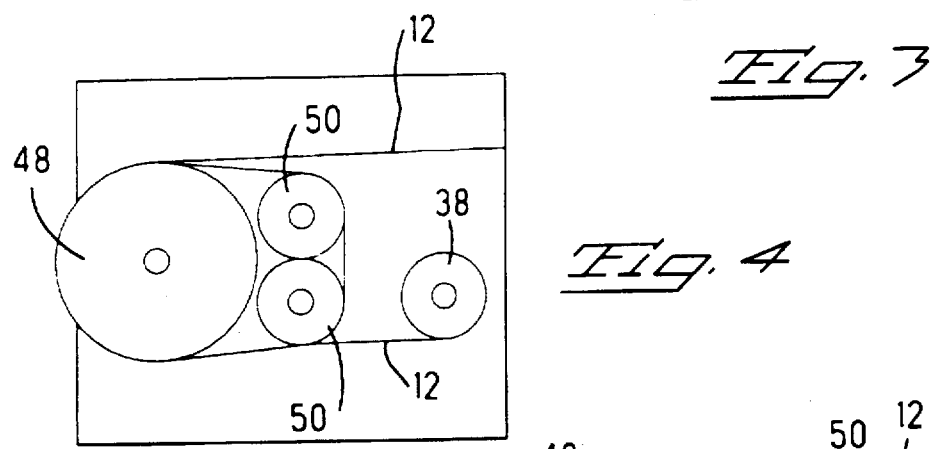
Fig. 4
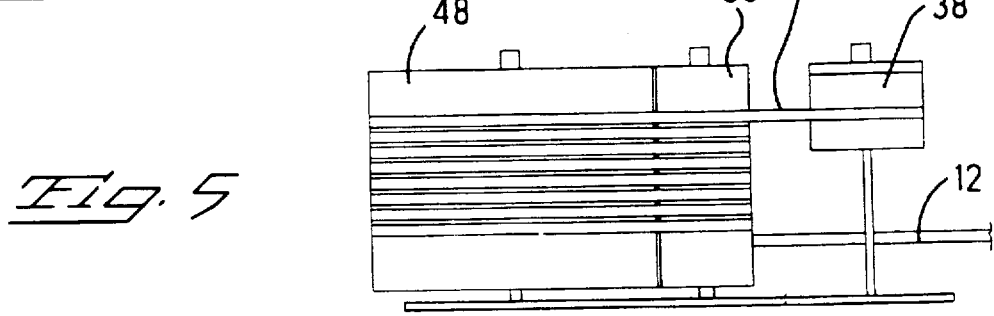
Fig. 5

LASER TRANSFER DEPOSITION

The present invention is directed to a process of material deposition or dry plating by a laser transfer technique.

BACKGROUND OF THE INVENTION

In the field of plating metal substrates, for example, particularly a process of plating with a precious metal such as Bold, selectively controlling the deposition of such plating metal is a significant cost saving step, often representing the difference between a commercially feasible process and a mere laboratory phenomenon.

The known processes fall within two generally accepted categories: wet plating and dry plating. Electroplating is a wet plating process. The process is most commonly carried out by forming an electrical circuit between the metallic workpiece and a spaced electrode, all while located in a liquid bath containing the material to be plated out, see U.S. Pat. No. 4,427,498 and U.S. Pat. No. 4,534,843.

These conventional electroplating processes can be quite costly and complicated, and can be hazardous. Waste treatment and disposal are also significant practical problems. Further complications ensue when conventional electroplating is used for selective depositing of the metal onto predetermined areas of the workpiece. Furthermore, recycling of expensive unused gold can lead to problems.

There are other conventional techniques for depositing a noble metal such as gold on a substrate. Evaporation of Bold contacts is in principle a dry plating or deposition alternative to wet electroplating. It is not considered practical, however, because conventional methods require high vacuum, deposit unnecessary Bold which requires extensive recycling, and are not easy to turn on and off for spot evaporation without heavily caking a shutter. Furthermore, conventional boat evaporation of certain alloy compositions needed for wear resistance may be difficult. Sputtering of alloys can deposit controlled composition required for wear requirements. However, excessive and unnecessary materials are deposited when selective deposition is required. Again, it required additional recycling. The shortcomings of these technologies illustrate the need for a method of deposition, in only specifically defined areas, with well-controlled thickness and the ability to maintain stoichiometry of the plating alloy.

A related dry method of gold deposition is suggested by the widespread use of pressure bonding of gold wires to pads in microelectronics packaging. Although this works for wires, it is not apparent how to apply the required pressure to a gold layer as little as 30µ" in such a way as to effect transfer to the intended stock.

U.S. Pat. No. 4,987,006, which is incorporated herein by reference, discloses a transfer method employing laser ablation of a very thin absorptive polymer layer (0.5 to 2 microns thick). The absorptive film is sandwiched between the metallic transfer layer and the transparent support plate. The rapid vaporization of a portion of the thin polymer caused high pressures to be exerted on the metallic layer resulting in metallic bond formation between the metallic layer and the target substrate (thick metallic substrate). The laser pulse would ablate 30 to 80 percent of the thickness of the polymer layer over the irradiated region. The percentage of ablation was determined primarily by energy density. The irradiated section of polymer and underlying metal film disengaged from the surrounding source. The metallic film bonds to the target substrate. The metallic film remains coated with the remaining 20 to 70 percent of the original polymer layer, referred to as residual polymer. Although possible, it is not desirable to ablate one hundred percent of the absorptive polymer during initial laser exposure. Some amount of extra polymer is desired in order to protect the surface of the metallic transfer layer from damage by the laser pulse, and also to lend physical support to the thin metal film. However, after the transfer, the presence of residual polymer was not desirable. The residual polymer had to be removed. This adds an additional step and production of waste during the process. This process also requires the use of a laser transparent support plate.

It would be desirable to provide method for transferring the metallic film without also transferring the residual polymer layer. It would also be desirable to provide a method in which it is unnecessary to have a laser transparent support plate.

SUMMARY OF THE INVENTION

The present invention avoids the problems of the previous inventions by applying the metallic film to a laser absorptive polymer. The transfer of the metallic film to a substrate is accomplished in a vacuum. The polymer remains intact and no residual polymer is transferred with the metallic film.

The present invention is directed to a method for producing a smooth and continuous pressure bonded layer of a material, selected from the group consisting of conductive, semiconductive, superconductive and insulating materials, on a base substrate through the driving force of a pulsed laser. The method comprises the steps of selecting a laser absorptive material. Then applying thereto a thin layer of the material for pressure bonding to the base substrate. Next, placing the base substrate and the thin layer of material on the laser absorptive material in a vacuum, then placing the base substrate in close proximity to the thin layer of material. Finally, directing pulsed laser energy toward the laser absorptive material and the layer to be pressure bonded, whereby the laser energy is absorbed by the laser absorptive material causing heating and vaporization thereof to a controlled depth of the laser absorptive material, leaving remaining portions of the laser absorptive material unvaporized after the vaporization to act as a support for the material to be bonded. After bonding, the thin material adheres to the base substrate when the remaining continuous absorptive material is peeled away, the vaporization having provided the necessary pressure for pressure bonding on to the base material.

BRIEF DESCRIPTION OF THE DRAWINGS

Embodiments of the present invention will now be described by way of example with reference to the accompanying drawings, in which:

FIG. 1 is cross sectional view showing the base substrate and the polymeric material;

FIG. 2 is a cross sectional view showing the transferred metal layer;

FIG. 3 is a schematic showing the vacuum chamber system;

FIG. 4 is a side view of the polymer pulley system; and

FIG. 5 is a top view of the polymer pulley system.

DETAILED DESCRIPTION OF THE INVENTION

The present invention is directed to a process for laser transfer deposition of a material, preferably such as a precious metal, onto a base substrate, preferably metallic. The base substrate could also be some other material, such as a plastic material, a circuit board, glass, a ceramic material, or any other material suitable for receiving the transferred material. The transferred material can be a conductive, semiconductive, superconductive, or an insulating material.

In the preferred practice of the invention, the material to be transferred, in this case gold or composite layers of precious metals, is deposited on a thin, laser absorptive, polymeric film. A layer of Ni is deposited on a reel of copper stock. A reel of Ni coated copper stock is used as the substrate. The nickel layer is then cleaned with an ion gun under vacuum prior to transfer. The gold layer is brought into close contact with the Ni layer while the whole system is under vacuum. A laser beam is then directed at the polymer layer. A portion of the polymer layer is ablated by the laser. Vaporization of a portion of the polymer layer produces a high pressure force to be exerted against the Au layer. The force pushes the Au against the Ni surface and results in bonding of the Au to the Ni surface.

FIG. 1 shows a polymeric material 12 having a metal layer 14 deposited thereon. The metal layer 14 is brought in close proximity to the metal substrate 16 as the base substrate onto which the layer will be transferred. Close proximity can include the case where the metal layer 14 and the metal substrate 16 are brought into contact with each other and it can also include the case where they are brought close enough, while not physically touching, such that the material can still be transferred. Typically, the metal surfaces are not exactly smooth and parallel on a microscopic scale. Therefore, some surface areas will be in contact while other surface areas will not be in contact with each other. Even in the surface areas that are not in contact with each other, but are close, the transfer will take place. A laser is directed toward the polymeric material 12 on the side opposite to the metal layer 14. A short laser pulse which is shaped optically to the desired shape of the deposit then vaporizes a portion of the thickness of the polymeric material 12. The vapor blow-off causes forces directed at the metal layer 14 and pushes the metal layer 14 toward the metal substrate 16 at a very high pressure, thereby causing pressure bonding. That is, the expanding vapor drives the metal layer at a rather high pressure. This action causes pressure bonding of the metal layer to the metal substrate.

During this process, the polymeric material 12 remains essentially intact, with only a portion of the polymeric material 12 being evaporated away. The continuous polymeric material 12 can then be separated from the transferred metal layer 14b by pulling it away from the metal substrate leaving the metal layer 14b bonded to the metal substrate, see FIG. 2. The polymeric material is cleanly removed leaving the transferred metal layer free of the polymeric material.

The metal substrate can be any metal suitable such as copper or a copper based alloy or some other suitable base material. The metal substrate can have further layers such as Ni, Pd, Ag, or Au. The metal layer to be transferred is typically Au, however, it could also be any other layer which needs to be transferred, such as cobalt hardened Au, Ni or Pd. Further, the metal layer can include multiple layers, such as a layer of Au, with a layer of Ni or Pd on top. Multiple layers can be transferred simultaneously thereby eliminating the need to first deposit one layer on the metal substrate. This also eliminates the need for sequential transfer of metal layers. Different thicknesses of the material can also be transferred. The current process allows very precise control over material thickness and the area to be transferred. By controlling the thickness of material deposited on the polymeric material, one can easily control the thickness to be transferred to the base substrate. By optically manipulating the shape of the laser beam, it is also possible to control the shape of the material to be transferred.

The specific polymeric layer used in the practice of this invention is one that is highly absorptive of the laser wavelength. Table I shows a series of representative lasers and their wavelengths. It should be noted at this juncture that an excimer laser and the ultraviolet harmonics of the Nd:Yag lasers (354 nm, and 266 nm), are the preferred laser sources, even though other lasers with similar wavelengths may be employed. Lasers operate at different wavelengths. For example, excimer lasers emit various UV wavelengths depending on the medium. At the opposite end of the spectrum are the infrared lasers such as carbon dioxide ($CO_2$) and neodymium doped yttrium-aluminum garnet (Nd:YAG).

TABLE I

| Excimer | 193, 248, 308, 351 nm |
|---|---|
| $CO_2$ | 10,600 nm |
| Nd:YAG | 1,064 nm |

Listed in Table II are a number of polymers and their coefficients of absorption for selected wavelengths of an excimer laser.

TABLE II

ABSORPTION COEFFICIENTS OF SELECTED POLYMERS AT VARIOUS WAVELENGTHS ($cm^{-1}$)

| | Wavelength | | |
|---|---|---|---|
| Polymer | 193 nm | 248 nm | 308 nm |
| Polyimide | $4.2 \times 10^5$ | $2.8 \times 10^5$ | $1.2 \times 10^5$ |
| Polysulfone | $4.0 \times 10^5$ | $1.5 \times 10^5$ | $8.1 \times 10^2$ |
| Novolac epoxy | $1.0 \times 10^5$ | $2.1 \times 10^4$ | $2.4 \times 10^3$ |
| Polycarbonate | $5.5 \times 10^5$ | $1.0 \times 10^4$ | $2.2 \times 10^1$ |
| Poly(a-methyl)styrene | $8.0 \times 10^5$ | $6.5 \times 10^3$ | $8.0 \times 10^1$ |
| Poly(methyl-methacrylate) | $2.0 \times 10^3$ | $6.5 \times 10^1$ | $<10^1$ |
| Poly(vinylacetate) | $1.0 \times 10^3$ | $<10^2$ | $<10^1$ |
| Polyethylene | $6.3 \times 10^2$ | $<10^1$ | $<10^1$ |
| Polypropylene | $5.3 \times 10^2$ | $<10^1$ | $<10^1$ |
| Polytetrafluorethylene | $2.6 \times 10^2$ | $1.4 \times 10^1$ | $<10^1$ |

Source "Laser Photoetching of Polymers" by Cole et al., Mat. Res. Symp. Proc. Vol. 72, 1986 Materials Research Society In order that reasonable laser pulses deliver sufficient energy density to effect vaporization, the preferred polymeric material for the excimer laser is polyimide as it absorbs strongly at several different excimer laser wavelengths. It is clear that other materials can be used for various other lasers and wavelengths.

It is also necessary that the laser absorptive material absorb enough of the laser energy to prevent the laser energy from reaching the metal layer to be transferred. If a material with a lower coefficient of absorption is used, the material can be made thicker and then it would be necessary to use a higher power laser beam. Conversely, thinner material can be used if the coefficient of absorption is higher, in this case, a lower power laser beam can be used.

The preferred practice of the invention involves transferring a layer of Au to a substrate made of copper, BeCu, bronze, phosphor bronze, or some other copper alloy, with a Ni layer deposited thereon. The polymeric substrate is polyimide film.

The process for transferring the metal layer is carried out in a vacuum chamber. It is found that the process works best in the vacuum chamber because the Ni layer can be cleaned with an ion gun and the surface will remain relatively clean within the chamber (with only a very thin oxide layer) before the transfer of the Au layer is accomplished. If the Ni layer is exposed to air, it will become contaminated and heavily oxidized quickly. When the surface of the Ni is contaminated or heavily oxidized, a higher pressure is needed to bond the Au to the Ni because the surface oxides and contamination must be cracked during the bonding to allow contact by the clean metals. In order to create a higher pressure to bond to a contaminated or oxidized surface, it would be necessary to have a larger amount of energy absorbed by the polyimide layer and would therefore require a higher power from the laser.

The process for transferring Au or some other metal layer onto a metal substrate is shown in FIG. 3. The transfer process is carried out in a vacuum chamber 30 and evacuated to a base pressure of about $10^{-5}$ Torr. The metal substrate 16 is a BeCu strip with 1.25 microns of Ni-plated on the surface. A supply reel 36 of the Ni-plated strip 16 is loaded in the main chamber 34 and is set up with pulleys so that it passes in front of an ion gun 44. The ion gun 44 is used to clean the Ni-plated substrate 16 in the main chamber 34. A supply reel 38 of polyimide film 12, such as KAPTON (a product of E.I. Du Pont De Nemours, Inc.), is loaded into a side chamber 42 for gold deposition. The substrate 16 and the film 12 are brought together to a transfer area 32 in the main chamber 34 by a series of pulleys, where the laser beam can ablate the polyimide layer and transfer the gold layer to the Ni surface of the substrate.

In the preferred embodiment, the Au 14 is deposited on the polyimide film 12 within the vacuum chamber, however, the Au layer 14 could also be deposited onto the polyimide film prior to assembling in the vacuum chamber. In this case, contaminants would need to be cleaned from the gold (e.g. by ion beam) prior to transfer. An aluminum shield 46 is used as a barrier between the Au deposition area and the main chamber with the ion gun 44 to protect the respective areas from cross contamination. The polyimide film 12 is wound around a pulley 48 several times to pass in front of the Au sputtering source 54, see FIG. 4. The use of a large pulley 48 keeps the film 12 relatively flat and acts as a heat sink to prevent it from curling due to heating by the Au sputtering process. Two smaller pulleys 50 are disposed behind the large pulley, opposite to the Au sputtering source to provide tension on the film 12. The combination of the large pulley and the two smaller pulleys 50 prevents the polyimide film from curling during the sputtering process. FIG. 5 shows a side view of the pulley system which shows that the polyimide film 12 is passed in front of the Au sputtering source several times, eight times in the preferred embodiment, before proceeding into the main chamber. Because the film 12 is passed in front of the Au source several times, filling the entire sputter pattern, the layer of Au 14 is more evenly distributed. Additionally, waste of Au is minimized.

The polyimide film is approximately 7 µm thick. The sputter target materials were soft gold (99.9% Au) and hard gold (99.9% Au/0.1% Co). A layer of gold one half to one micron (20–40 µinches) thick was deposited onto the polyimide film. The sputtering was accomplished at $8\times10^{-3}$ Torr Argon ($10^{-5}$ Torr base pressure).

The cleaning of the target Ni-plated substrate refers to removing the nickel oxide layer and other contaminants which inhibit metallic bond formation. This step may be skipped if Ni deposition occurs within the chamber in which case the Ni is already clean. An argon ion gun 44 is used to strip off contaminants on the surface of the target substrate. The Ni surface was cleaned while the vacuum system was maintained at $2\times10^{-4}$ Torr Argon ($10^{-5}$ Torr base pressure) because of the requirements of the ion gun 44. After the Ni surface is cleaned and then the sputtering was accomplished, the sputtering system was shut down and the pressure dropped to the base pressure of $10^{-5}$ Torr. With suitable differential pumping, the necessary pressures can be maintained at each station continuously, for a continuous process.

Gold deposited polyimide film 12 and nickel coated copper tape 16 are brought together in the laser transfer area 32 by a series of pulleys. The Au side of the polyimide film makes contact with the cleaned Ni surface as is seen in FIG. 1. At the transfer area, a pulse from the excimer laser strikes the polyimide film 12. A small amount of the film 12 is ablated and generates enough pressure to bond a spot of Au 14 on the Ni-plated substrate 16. The polyimide film and the Ni substrate are taken up onto a reel 52 which can later be easily removed from the chamber.

A single 308 nm pulse from the excimer laser strikes the polyimide surface where it is absorbed in the first few microns of penetration. With an absorption coefficient of $1.2\times10^5$ cm$^{-1}$, polyimide is a very strong absorber at 308 nm. Front surface ablation occurs because of the rapid absorption. The material from the ablation zone is rapidly expelled backwards, opposite to the direction of the incident beam. By conservation of momentum, the film and the gold will be forced into the target substrate.

Following the transfer, the polyimide film was adhered to the Ni substrate at the transfer spots. The polyimide film was then pulled away from the Ni substrate leaving the Au spots adhered to the Ni substrate.

Due to the lower energy density requirements with vacuum cleaned surface, larger sized spots can be transferred with the excimer laser (XeCl, 308 nm, 24 ns pulse).

Clean circular spots of soft gold are reliably transferred at energy densities of 6 J/cm$^2$. Hard gold (99.9% Au/0.1% Co) is reliably transferred at 10 J/cm$^2$.

The resulting transferred gold was found to be fairly adherent. The sputter-deposited gold on polyimide was well adhered to the polyimide in the first place, but after laser transfer, the gold detaches from the polyimide when it is peeled away; being even more strongly bonded to the nickel metal substrate. The gold withstands subsequent multiple adhesive tape-pull tests. Transfers of Au were successful up to pressures of $10^{-1}$ Torr Argon ($10^{-5}$ Torr base pressure).

The advantages of the present invention are that a metal layer can be transferred by laser cleanly without residual polymer on its surface. The use of a vacuum system allows the surface of the base substrate to be cleaned so that lower energies can be used in order to transfer the metal layer. The current invention does not require a laser transparent carrier such as quartz or glass. Finally, several layers can be transferred onto the base substrate simultaneously.

We claim:

1. In a method for producing a smooth and continuous pressure bonded layer of a material, selected from the group consisting of conductive, semiconductive, superconductive and insulating materials, on a base substrate through the driving force of a pulsed laser, the improvement comprising in combination therewith, the steps of (a) selecting a laser absorptive material which will provide structural support for said material for pressure bonding to said base substrate;

(b) applying thereto a thin layer of said material for pressure bonding to said base substrate;

(c) placing said base substrate and said thin layer of material on said laser absorptive material in a vacuum, then placing said base substrate in close proximity to said thin layer of material; and (d) directing pulsed laser energy toward said laser absorptive material and said layer to be pressure bonded, whereby said laser energy is absorbed by said laser absorptive material causing heating and vaporization thereof to a controlled depth of said laser absorptive material, leaving remaining portions of said laser absorptive material unvaporized after said vaporization to act as a support for the material to be bonded, after bonding, the thin material adheres to the base substrate when the remaining continuous absorptive material is peeled away, said vaporization providing the necessary pressure for pressure bonding on to said base material, and no laser transparent material is used to provide structural support.

2. The method of claim 1, wherein the material to be pressure bonded is gold, a gold alloy, palladium, or palladium alloy.

3. The method of claim 1, wherein the material to be pressure bonded is multiple layers of precious metals.

4. The method of claim 1, wherein said laser is an ultraviolet laser and said polymeric film has an optical coefficient of absorption of at least $2 \times 10^4$ cm$^{-1}$ at the ultraviolet wavelength.

5. The method of claim 4, wherein said laser is an excimer laser.

6. The method of claim 1, wherein said laser operates at a given wavelength and said laser absorptive layer has a coefficient of absorption at the wavelength sufficient to prevent the laser beam from reaching the material to be transferred.

7. The method of claim 1, wherein the laser absorptive layer is a polymeric film.

8. The method of claim 1, wherein the base substrate is a metal.

9. The method of claim 1, wherein the base substrate is a metal alloy.

10. The method of claim 1, wherein the base material is a metal or an alloy coated with a thin metal layer.

11. The method of claim 1, further comprising cleaning the surface of the base substrate with an ion gun while the material is under vacuum, prior to transferring the layer of material to be transferred.

12. The method of claim 1, further comprising depositing a surface layer of material on the base material while the base material is under vacuum, thereby forming a clean surface for the laser transfer.

13. The method of claim 12, wherein the polymeric film is polyimide.

14. The method of claim 1, wherein the thin layer of the material for pressure bonding is deposited on the laser absorptive material while in a vacuum chamber.

15. The method of claim 14, wherein the thin layer is deposited by sputtering onto the laser absorptive material.

16. The method of claim 1, wherein various layers of materials are deposited each on different strips of the laser absorptive material and are successively transferred to the base substrate by the laser, the transferred areas are shaped by variable optical adjustment of the laser.

* * * * *